(12) United States Patent
Okuda (10) Patent No.: US 7,868,716 B2
(45) Date of Patent: Jan. 11, 2011

(54) ACOUSTIC WAVE FILTER APPARATUS

(75) Inventor: Tetsuro Okuda, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 39 days.

(21) Appl. No.: 12/505,604

(22) Filed: Jul. 20, 2009

(65) Prior Publication Data

US 2009/0273409 A1 Nov. 5, 2009

Related U.S. Application Data

(63) Continuation of application No. PCT/JP2007/074920, filed on Dec. 26, 2007.

(30) Foreign Application Priority Data

Feb. 2, 2007 (JP) .............................. 2007-023886

(51) Int. Cl.
*H03H 9/72* (2006.01)
*H03H 9/64* (2006.01)
(52) U.S. Cl. ...................................... 333/133; 333/193
(58) Field of Classification Search ................ 333/133, 333/193–196; 310/313 B
See application file for complete search history.

(56) References Cited

U.S. PATENT DOCUMENTS 7,283,016 B2 * 10/2007 Haruta et al. ................ 333/133
7,804,380 B2 * 9/2010 Funahashi et al. ........... 333/133

2002/0135267 A1 9/2002 Takamine
2004/0196119 A1 10/2004 Shibahara et al.

FOREIGN PATENT DOCUMENTS

| JP | 2002-208832 A | 7/2002 |
| JP | 2004-282707 A | 10/2004 |
| WO | 2006/003787 A1 | 1/2006 |

OTHER PUBLICATIONS

Official Communication issued in International Patent Application No. PCT/JP2007/074920, mailed on Apr. 1, 2008.

* cited by examiner

*Primary Examiner*—Barbara Summons
(74) *Attorney, Agent, or Firm*—Keating & Bennett, LLP

(57) ABSTRACT

An acoustic wave filter apparatus where first balance input/output terminals of first and second acoustic wave filter sections are commonly connected to each other and then connected to a first balance terminal, second balance input/output terminals thereof are commonly connected to each other and then connected to a second balanced terminal, the first and second balance input/output terminals of the first acoustic wave filter section are coupled to the first and second balance terminals, respectively, via first and third wiring lines and first and third acoustic wave resonators, respectively, the first and second balance input/output terminals of the second acoustic wave filter section are coupled to the first and second balance terminals, respectively, via second and fourth wiring lines and second and fourth acoustic wave resonators, respectively, and the second wiring line and the third wiring line cross each other on a piezoelectric substrate.

7 Claims, 9 Drawing Sheets

ACOUSTIC WAVE FILTER APPARATUS

BACKGROUND OF THE INVENTION

1. Field of the Invention

The present invention relates to an acoustic wave filter apparatus having a balance-unbalance conversion function. More specifically, the present invention relates to an acoustic wave filter apparatus having a structure in which first and second acoustic wave filter sections are located on one piezoelectric substrate, first balance terminals of the first and second acoustic wave filter sections are commonly coupled to each other, and second balance terminals thereof are commonly coupled to each other.

2. Description of the Related Art

In recent years, cell phones and the like have been required to include a filter apparatus having multiple passbands. As one example of this type of filter apparatus, the following Japanese Unexamined Patent Application Publication No. 2002-208832 discloses a surface acoustic wave filter apparatus shown in FIG. 16.

Figure 16:
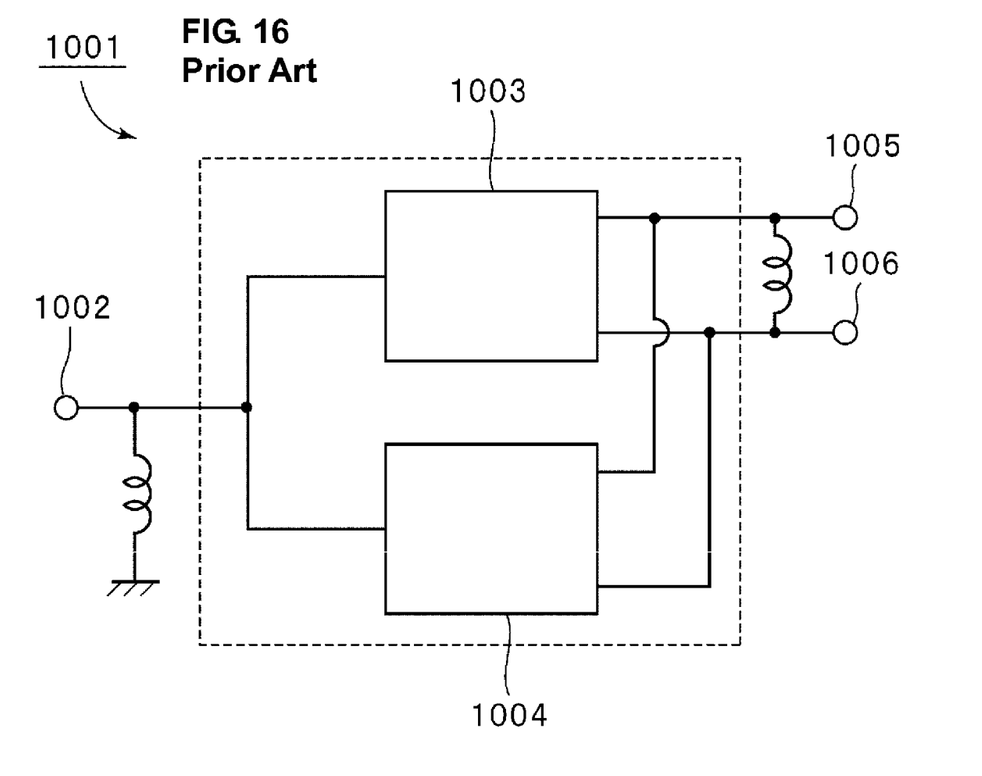
FIG. 16 is a schematic plan view showing an electrode structure of a related-art surface acoustic wave filter apparatus.

In a surface acoustic wave filter apparatus 1001 shown in FIG. 16, unbalance input terminals of first and second surface acoustic wave filter sections 1003 and 1004 are coupled to an unbalance terminal 1002. The surface acoustic wave filter sections 1003 and 1004 are surface acoustic wave filters each having an unbalance input terminal and first and second balance output terminals and having a balance-unbalance conversion function. First balance output terminals of the first and second surface acoustic wave filter sections 1003 and 1004 are commonly coupled to each other and then coupled to a first balance terminal 1005. Similarly, second balance output terminals thereof are commonly coupled to each other and then coupled to a second balance terminal 1006.

Figure 17:
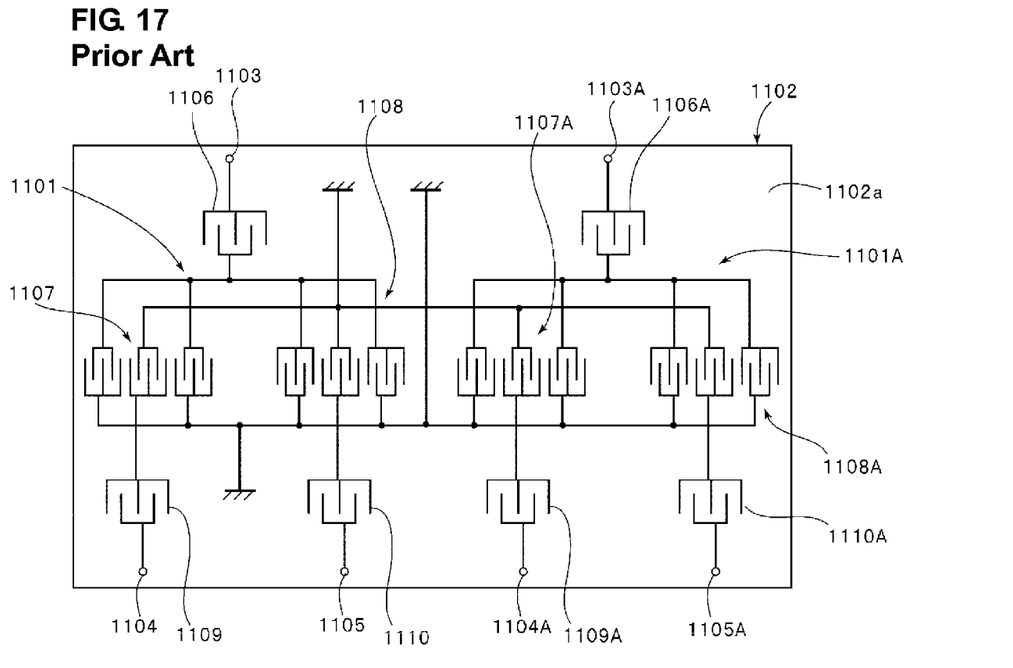
FIG. 17 is a schematic plan view showing an electrode structure of another example of a related-art surface acoustic wave filter apparatus.

On the other hand, WO2006/003787 discloses a surface acoustic wave filter apparatus shown in FIG. 17. As shown in FIG. 17, in the surface acoustic wave filter apparatus, an illustrated electrode structure is formed on a piezoelectric substrate 1102. Here, a first surface acoustic wave filter section 1101 is coupled between an unbalance input terminal 1103 and first and second balance terminals 1104 and 1105. The first surface acoustic wave filter section 1101 includes three-IDT-type, longitudinally coupled resonator-type surface acoustic wave filter elements 1107 and 1108. Input terminals of the longitudinally coupled resonator-type surface acoustic wave filter elements 1107 and 1108 are commonly coupled to each other and then coupled to an unbalance terminal 1103 via a surface acoustic wave resonator 1106. An output terminal of the longitudinally coupled resonator-type surface acoustic wave filter element 1107 is coupled to the first balance terminal 1104 via a surface acoustic wave resonator 1109. Similarly, an output terminal of the longitudinally coupled resonator-type second surface acoustic wave filter element 1108 is coupled to the second balance terminal 1105 via a surface acoustic wave resonator 1110.

Also, a surface acoustic wave filter section 1101A, which is another surface acoustic wave filter section, is formed on the piezoelectric substrate 1102. The second surface acoustic wave filter section 1101A has the same configuration as that of the first surface acoustic wave filter section 1101. Therefore, corresponding portions of the second surface acoustic wave filter section 1101A are shown using reference numerals where A is added to each of the reference numerals of corresponding portions of the first surface acoustic wave filter section 1101. Thus, the description of the first surface acoustic wave filter section 1101 is used.

In the surface acoustic wave filter apparatus described in Japanese Unexamined Patent Application Publication No. 2002-208832, the first balance output terminals of the first and second surface acoustic wave filter sections 1003 and 1004 are commonly coupled to each other and the second balance output terminals thereof are commonly coupled to each other. In this configuration, a wiring line for commonly coupling the first balance output terminals and one for commonly coupling the second balance output terminals tend to be longer. This has caused a problem that the surface acoustic wave filter apparatus is affected by parasitic capacitances, inductances, or resistances of the wiring lines and thus the insertion loss is increased or the balancing is deteriorated.

Even if the surface acoustic wave filter apparatus described in WO2006/003787 is deformed and the first balance output terminals are commonly coupled to each other and the second balance output terminals are commonly coupled to each other as in the surface acoustic wave filter apparatus 1001 described in Japanese Unexamined Patent Application Publication No. 2002-208832, the surface acoustic wave filter apparatus is easily affected by parasitic capacitances, inductances, or resistances of the wiring lines as well. For this reason, the insertion loss may be increased or the balancing may be deteriorated as well.

SUMMARY OF THE INVENTION

In view of the current situation of the related art, preferred embodiments of the present invention provide an acoustic wave filter apparatus that includes multiple acoustic wave filter sections each having a balance-unbalance conversion function and a reduced insertion loss, and the balancing is prevented from deteriorating even if first balance input/output terminals of the surface acoustic wave filter sections are commonly coupled to each other and second balance input/output terminals thereof are commonly coupled to each other.

According to a preferred embodiment of the present invention, an acoustic wave filter apparatus includes first and second acoustic wave filter sections having different passbands and each having a balance-unbalance conversion function. The acoustic wave filter apparatus includes: a piezoelectric substrate; a first acoustic wave filter section disposed on the piezoelectric substrate, the first acoustic wave filter section having an unbalance input/output terminal and first and second balance input/output terminals, the first acoustic wave filter section having a balance-unbalance conversion function; and a second acoustic wave filter section disposed on the piezoelectric substrate, the second acoustic wave filter section having an unbalance input/output terminal and first and second balance input/output terminals, the second acoustic wave filter section having a balance-unbalance conversion function. The unbalance input/output terminals of the first and second acoustic wave filter sections are coupled to first and second unbalance terminals, respectively. The first balance input/output terminals of the first acoustic wave filter section and the first balance input/output terminal of the second acoustic wave filter section are commonly coupled to each other and coupled to a first balance terminal. The second balance input/output terminals of the first and second are commonly coupled to each other and coupled to a second balance terminal. The first and second acoustic wave filter sections are arranged such that a signal flowing to the first balance terminal and a signal flowing to the second balance terminal have opposite phases. The acoustic wave filter apparatus further includes: a first acoustic wave resonator coupled between the first balance input/output terminal of the first acoustic wave filter section and the first balance terminal; a second acoustic wave resonator coupled between the first balance input/output terminal of the second acoustic wave filter section and the first balance terminal, the second acoustic wave resonator having a resonant frequency different from a resonant frequency of the first acoustic wave resonator; a third acoustic wave resonator coupled between the second balance input/output terminal of the first acoustic wave filter section and the second balance terminal; a fourth acoustic wave resonator coupled between the second balance input/output terminal of the second acoustic wave filter section and the second balance terminal, the fourth acoustic wave resonator having a resonant frequency different from a resonant frequency of the third acoustic wave resonator; and first to fourth wiring lines electrically coupled to the first to fourth acoustic wave resonators to the first balance input/output terminal of the first acoustic wave filter section, the first balance input/output terminal of the second acoustic wave filter section, the second balance input/output terminal of the first acoustic wave filter section, and the second balance input/output terminal of the second acoustic wave filter section, respectively. The second wiring line coupling the second acoustic wave resonator to the first balance input/output terminal of the second acoustic wave filter section and the third wiring line coupling the third acoustic wave resonator to the second balance input/output terminal of the first acoustic wave filter section cross each other on the piezoelectric substrate.

In the acoustic wave filter apparatus according to a preferred embodiment of the present invention, the first to fourth acoustic wave resonators are preferably arranged along a direction on the piezoelectric substrate in the order presented. In this case, the first to fourth acoustic wave resonators can be smoothly disposed on the piezoelectric substrate. Also, according to a preferred embodiment of the present invention, the influence of capacitances, inductances, or resistances attributable to the installation of the wiring lines on the piezoelectric substrate can be greatly reduced and minimized. Thus, an increase in insertion loss and deterioration of the balancing can be prevented.

In the acoustic wave filter apparatus according to a preferred embodiment of the present invention, a passband of the second acoustic wave filter section is preferably located in a higher band than a bandpass of the first acoustic wave filter section. Also, the acoustic wave filter apparatus preferably further includes fifth and sixth acoustic wave resonators arranged to provide impedance adjustment and coupled to the second and fourth acoustic wave resonators in series. In this case, by coupling the fifth and sixth acoustic wave resonators, the impedance in the first acoustic wave filter section passband, of the second acoustic wave filter section seen from the balance terminal can be increased. Therefore, the insertion loss in the first acoustic wave filter section can be reduced and minimized.

In the acoustic wave filter apparatus according to a preferred embodiment of the present invention, the first acoustic wave filter section preferably includes a longitudinally coupled resonator-type first acoustic wave filter element including at least three IDTs and a longitudinally coupled resonator-type second acoustic wave filter element including at least three IDTs. Also, ends of the first and second acoustic wave filter elements are preferably coupled to the first unbalance terminal. The other end of the first acoustic wave filter element is preferably coupled to the first balance terminal. The other end of the second acoustic wave filter element is preferably coupled to the second balance terminal. In this case, the first acoustic wave filter section has a configuration where the longitudinally coupled resonator-type first and second filter elements each including at least three IDTs are coupled commonly to the first unbalance terminal. Therefore, by only adjusting the polarity of the IDTs, a balance-unbalance conversion function can be easily realized.

In the acoustic wave filter apparatus according to a preferred embodiment of the present invention, the second acoustic wave filter section preferably includes a longitudinally coupled resonator-type first acoustic wave filter element including at least three IDTs and a longitudinally coupled resonator-type second acoustic wave filter element including at least three IDTs. Also, ends of the first and second acoustic wave filter elements are preferably commonly coupled to each other and then coupled to the second unbalance terminal. The other end of the first acoustic wave filter element is preferably coupled to the first balance terminal. The other end of the second acoustic wave filter element is preferably coupled to the second balance terminal. In this case, the second acoustic wave filter section includes the longitudinally coupled resonator-type first and second acoustic wave filter elements each including at least three IDTs. Therefore, by simply designing the IDTs, a balance-unbalance conversion function can be easily realized.

In the acoustic wave filter apparatus according to a preferred embodiment of the present invention, a surface acoustic wave may preferably be used as an acoustic wave, for example. In this case, a surface acoustic wave filter apparatus according to a preferred embodiment of the present invention is provided.

Also, in the acoustic wave filter apparatus according to a preferred embodiment of the present invention, an acoustic boundary wave may be used as an acoustic wave. In this case, an acoustic boundary wave filter apparatus that further includes a dielectric material laminated on the piezoelectric substrate and uses an acoustic boundary wave propagating over an interface between the piezoelectric second and dielectric material is provided.

In the acoustic wave filter apparatus according to a preferred embodiment of the present invention, the unbalance input/output terminal of the first acoustic wave filter section is coupled to the first unbalance terminal, and the unbalance input/output terminal of the second acoustic wave filter section is coupled to the second unbalance terminal. The first balance input/output terminals of the first and second acoustic wave filter sections are commonly coupled to the first balance terminal. The second balance input/output terminals thereof are commonly coupled to the second balance terminal. The first to fourth acoustic wave resonators are coupled between the first and second acoustic wave resonators and first and second balance terminals. In this configuration, the second wiring line coupling the second acoustic wave resonator to the first balance input/output terminal of the second acoustic wave filter section and the third wiring line coupling the third acoustic wave resonator to the second balance input/output terminal of the first acoustic wave filter section cross each other on the piezoelectric substrate. Thus, the wiring lines coupling the first and second acoustic wave filter sections to the first and second balance terminals can be shortened so that the wiring patterns can be simplified. Therefore, the differences in stray capacitance, inductance, and resistance between the balance signal lines can be reduced so that the deterioration of the balancing can be restrained. Also, since the wiring lines through which balance signals pass can be shortened, a loss due to the resistance can be reduced so that the insertion loss can be reduced.

Also, since the second acoustic wave resonator coupled to the second acoustic wave filter section is disposed between the first and third acoustic wave resonators coupled to the first acoustic wave filter section, in other words, since the first and third acoustic wave resonators coupled to the first acoustic wave filter section and the second and fourth acoustic wave resonators coupled to the second acoustic wave filter section are alternately disposed in a direction on the piezoelectric substrate, the intervals between the acoustic wave resonators can be expanded. Therefore, the coupling capacitances between the acoustic wave resonators can be reduced so that the insertion loss can be further reduced.

As described above, according to various preferred embodiments of the present invention, the deterioration of the balancing can be prevented and the insertion loss can be reduced. Also, since the wiring patterns can be shortened, the sizes of chips of the acoustic wave filter apparatus can be reduced.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Now, the present invention will be clarified by describing specific preferred embodiments of the present invention with reference to the accompanying drawings.

Figure 1:
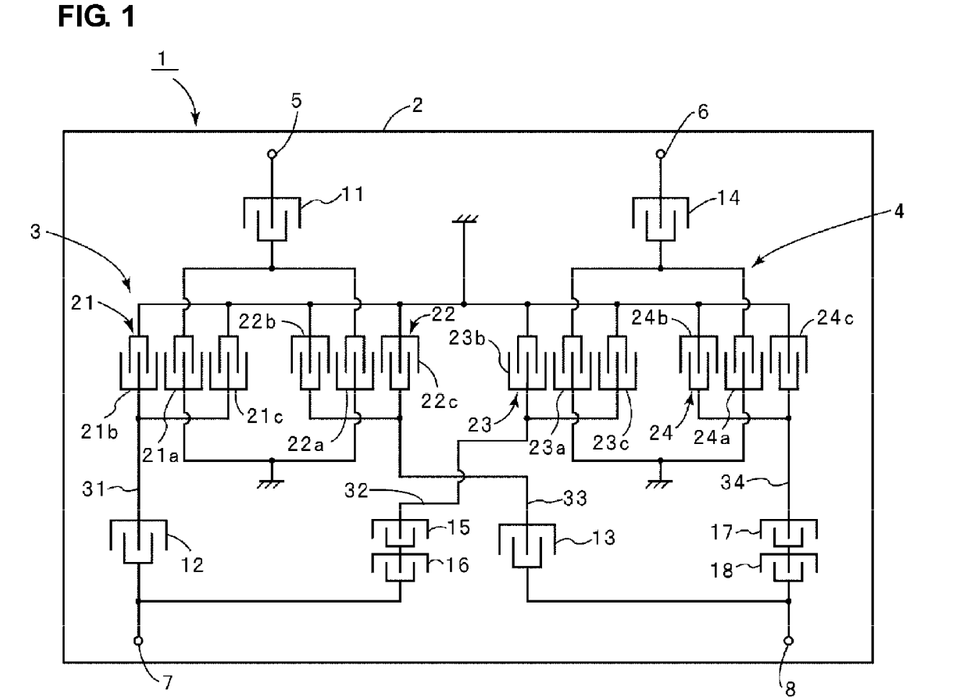
FIG. 1 is a schematic plan view of a surface acoustic wave filter apparatus according to a first preferred embodiment of the present invention.

FIG. 1 is a schematic plan view showing a surface acoustic wave filter apparatus 1 serving as an acoustic wave apparatus according to a first preferred embodiment of the present invention. The surface acoustic wave filter apparatus 1 includes a piezoelectric substrate 2.

In this preferred embodiment, the piezoelectric substrate 2 is preferably made of 38.5° Y-cut X propagation $LiTaO_3$, for example. Alternatively, the piezoelectric substrate 2 may be made of different piezoelectric monocrystal or piezoelectric ceramic or other suitable material.

The surface acoustic wave filter apparatus 1 preferably is a reception filter apparatus for use in, for example, a cell phone. The surface acoustic wave filter apparatus 1 includes first and second surface acoustic wave filter sections 3 and 4. The first and second surface acoustic wave filter sections 3 and 4 each have a balance-unbalance conversion function. The first surface acoustic wave filter section 3 is a DCS reception filter section. The second surface acoustic wave filter section 4 is a PCS reception filter section. That is, the surface acoustic wave filter apparatus 1 is a one-chip, dual-band filter where the first and second surface acoustic wave filter sections 3 and 4 are disposed on the single piezoelectric substrate 2. The surface acoustic wave filter apparatus 1 includes two unbalance terminals and a pair of balance terminals, that is, first and second unbalance terminals 5 and 6 and first and second balance terminals 7 and 8.

An unbalance input terminal of the first surface acoustic wave filter section 3 is coupled to the first unbalance terminal 5 via a one-port-type surface acoustic wave resonator 11. A first balance output terminal of the first surface acoustic wave filter section 3 is coupled to the first balance terminal 7 via a one-port-type surface acoustic wave resonator 12.

A second balance output terminal of the first surface acoustic wave filter section 3 is coupled to the second balance terminal 8 via a one-port-type surface acoustic wave resonator 13.

On the other hand, an unbalance input terminal of the second surface acoustic wave filter section 4 is coupled to the second unbalance terminal 6 via a one-port-type surface acoustic wave resonator 14. A first balance output terminal of the second surface acoustic wave filter section 4 is coupled to the first balance terminal 7 via one-port-type surface acoustic wave resonators 15 and 16. A second balance output terminal of the second surface acoustic wave filter section 4 is coupled to the second balance terminal 8 via one-port-type surface acoustic wave resonators 17 and 18.

The first surface acoustic wave filter section 3 includes first and second surface acoustic wave filter elements 21 and 22.

The first surface acoustic wave filter element 21 is a three-IDT-type, longitudinally coupled resonator-type surface acoustic wave filter element including a first IDT 21a and second and third IDTs 21b and 21c disposed on both sides of the first IDT 21a in the surface acoustic wave propagation direction.

Figure 2:
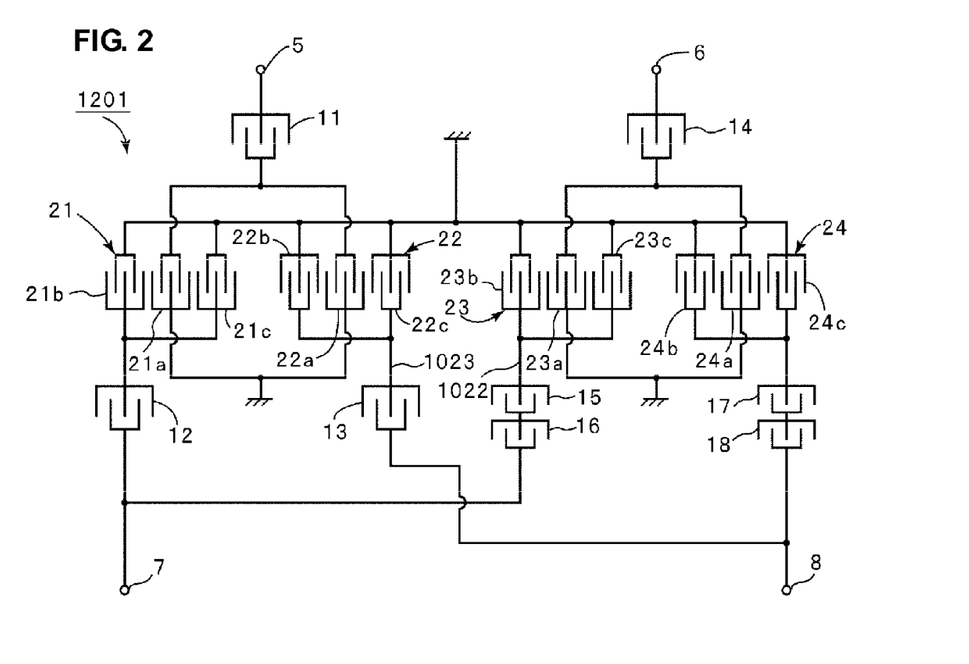
FIG. 2 is a schematic plan view showing an electrode structure of a surface acoustic wave filter apparatus prepared to make a comparison.

While the IDTs of the longitudinally coupled resonator-type surface acoustic wave filter sections are schematically shown in FIGS. 1 and 2, it is pointed out that illustration of reflectors are omitted. For example, in the surface acoustic wave filter element 21, reflectors are provided on both sides in the surface acoustic wave propagation direction, of the area where the IDTs 21a to 21c are provided. However, the illustration of the reflector is omitted to avoid complication of the drawings. Similarly, while only an IDT is shown with respect to each of the above-mentioned one-port-type surface acoustic wave resonators 11 to 18, reflectors are actually provided on both sides of each IDT. Illustration of these reflectors is also omitted to avoid complication of the drawings.

One end of the centrally disposed first IDT 21a of the first surface acoustic wave filter element 21 is coupled to the first unbalance terminal 5 via the one-port-type surface acoustic wave resonator 11. The other end of the IDT 21a is coupled to a ground potential. Ends of the second and third IDTs 21b and 21c are commonly coupled to each other and then coupled to a ground potential. The other ends thereof are commonly coupled to each other and then coupled to the first balance terminal 7 via the surface acoustic wave resonator 12.

Similarly, the second surface acoustic wave filter section 22 is a three-IDT-type, longitudinally connected resonator-type surface acoustic wave filter element including IDTs 22a to 22c. One end of the centrally disposed first IDT 22a is coupled to the first unbalance terminal 5 via the surface acoustic wave resonator 11, and the other end thereof is coupled to the ground potential. Ends of the second and third IDTs 22b and 22c disposed on both sides are commonly coupled to each other and then coupled to the ground potential. The other ends thereof are commonly coupled to each other and then coupled to the second balance terminal 8 via the one-port-type surface acoustic wave resonator 13.

The IDTs 21a to 21c and IDTs 22a to 22c are arranged so that, as for signals inputted from the first unbalance terminal 5, a signal flowing through the first and second surface acoustic wave filter elements 21 and 22 and the one-port-type surface acoustic wave resonator 12 into the first balance terminal 7 is 180° out of phase with a signal flowing through the second surface acoustic wave filter element 22 and one-port-type surface acoustic wave resonator 13 into the second balance terminal 8. Thus, the first surface acoustic wave filter section 3 has a balance-unbalance conversion function.

On the other hand, the second surface acoustic wave filter section 4 preferably has approximately the same configuration as that of the first surface acoustic wave filter section 3. Specifically, the second surface acoustic wave filter section 4 is provided with first and second surface acoustic wave filter elements 23 and 24. As with the first surface acoustic wave filter element 21, the first surface acoustic wave filter element 23 includes first to third IDTs 23a to 23c. As with the second surface acoustic wave filter element 22, the second surface acoustic wave filter element 24 includes first to third IDTs 24a to 24c. The first IDTs 23a and 24a are commonly coupled to each other and then coupled to the second unbalance terminal 6 via the one-port-type surface acoustic wave resonator 14. The other ends thereof are commonly coupled to each other and then coupled to a ground potential. Ends of the second and third IDTs 23b and 23c are commonly coupled to each other and then coupled to a ground potential, and ends of the second and third IDTs 24b and 24c are commonly coupled to each other and then coupled to the ground potential. The other ends of the IDTs 23b and 23c are commonly coupled to each other and then coupled to the first balance terminal 7 via the one-port-type surface acoustic wave resonators 15 and 16. The other ends of the second and third IDTs 24b and 24c are commonly coupled to each other and then coupled to the second balance terminal 8 via the one-port-type surface acoustic wave resonators 17 and 18.

Also in the second surface acoustic wave filter section 4, the polarity of the IDTs 23a to 23c and the IDTs 24a to 24c is adjusted to realize a balance-unbalance conversion function.

One of the unique features of the surface acoustic wave filter apparatus 1 according to this preferred embodiment is that the one-port-type surface acoustic wave resonators 12, 13, 16, and 18 are coupled in the above-mentioned manner. Hereafter, the one-port-type surface acoustic wave resonator 12 coupled to the first balance terminal 7 will be referred to as a first surface acoustic wave resonator, the surface acoustic wave resonator 16 coupled thereto will be referred to as a second surface acoustic wave resonator, the one-port-type surface acoustic wave resonator 13 coupled to the second balance terminal 8 will be referred to as a third surface acoustic wave resonator, and the one-port-type surface acoustic wave resonator 18 will be referred to as a fourth acoustic wave resonator.

The first surface acoustic wave resonator 12 is coupled to the first surface acoustic wave filter element 21 of the first surface acoustic wave filter section 3 via a first wiring line 31. The second surface acoustic wave resonator 16 is coupled to the first surface acoustic wave filter element 23 of the second surface acoustic wave filter section 4 via a second wiring line 32. The third acoustic wave resonator 13 is coupled to the second surface acoustic wave filter element 22 of the first surface acoustic wave filter section 3 via a third wiring line 33. The fourth acoustic wave resonator 18 is coupled to the second surface acoustic wave filter element 24 of the second surface acoustic wave filter section 4 via a fourth wiring line 34. The second wiring line 32 and third wiring line 33 cross each other on the piezoelectric substrate 2 as shown in the drawing.

That is, in this preferred embodiment, the first balance output terminals of the first and second surface acoustic wave filter sections 3 and 4 are commonly coupled to each other and the second balance output terminals thereof are also commonly coupled to each other. The second surface acoustic wave resonator 16 and third surface acoustic wave resonator 13 are arranged so that the second wiring line 32 and third wiring line 33 cross each other.

In practice, the portion where the second wiring line 32 and third wiring line 33 cross each other has a three-dimensional cross structure where an insulating layer is interposed between the two wiring lines. This prevents a short circuit between the second wiring line 32 and third wiring line 33.

As described above, in this preferred embodiment, the first surface acoustic wave resonator 12, second surface acoustic wave resonator 16, third surface acoustic wave resonator 13, and fourth surface acoustic wave resonator 18 are arranged along one direction in the presented order on the piezoelectric substrate 2. Also, the second wiring line 32 and third wiring line 33 cross each other. Therefore, the balancing of a signal between the first and second balance terminals 7 and 8 can be improved and the insertion loss can be reduced. Further, the surface acoustic wave filter apparatus can be downsized. This will be described on the basis of a specific experimental example.

The surface acoustic wave filter apparatus 1 was manufactured in accordance with the specifications described in the following paragraphs.

The passband of the first surface acoustic wave filter section 3: 1805 MHz to 1880 MHz The passband of the second surface acoustic wave filter section 4: 1930 MHz to 1990 MHz The First Surface Acoustic Wave Filter Section 3

The numbers of the electrode fingers of the IDT 21b, IDT 21a, and IDT 21c: 23, 35, and 23, respectively The numbers of the electrode fingers of the IDT 22b, IDT 22a, and IDT 22c: 23, 35, and 23, respectively The cross width of the electrode fingers: 74 μm The duty ratio: 0.66

The electrode film thickness: 0.091λ (198 nm)

The number of the electrode fingers of a reflector: 120 (The second surface acoustic wave filter section 4)

The numbers of the electrode fingers of the IDT 23b, IDT 23a, and IDT 23c: 31, 61, and 31, respectively The numbers of the electrode fingers of the IDT 24b, IDT 24a, and IDT 24c: 31, 61, the 31, respectively The number of the electrode fingers of a reflector: 120

The cross width of the electrode fingers: 64 μm

The duty ratio: 0.63λ

The electrode film thickness: 0.081λ (166 nm)

Surface Acoustic Wave Resonators

The number of the electrode fingers of the surface acoustic wave resonators 12 and 13: 240 each The cross width of the electrode fingers: 58 μm The number of the electrode fingers of a reflector: 15

The numbers of the electrode fingers of the IDTs of the surface acoustic wave resonators 16 and 18: 240 each The cross width of the electrode fingers: 60 μm The number of the electrode fingers of a reflector: 15

The numbers of the electrode fingers of the IDTs of the surface acoustic wave resonators 15 and 17: 109 each The number of the electrode fingers of a reflector: 15

The numbers of the electrode fingers of the IDTs of the surface acoustic wave resonators 11 and 14: 301, 331, respectively; none of the resonators including a reflector The cross widths of the electrode fingers of the surface acoustic wave resonators 11 and 14: 100 μm, 61 μm, respectively The reflectors of the surface acoustic wave resonators 12, 13, 15, and 17 are preferably apodized.

To make a comparison, a surface acoustic wave filter apparatus 1201 configured as described above except that the surface acoustic wave filter apparatus 1201 has an electrode structure shown in FIG. 2 was manufactured. The surface acoustic wave filter apparatus 1201 has the same configuration as that of the surface acoustic wave filter apparatus 1 except that the surface acoustic wave resonator 13 and the surface acoustic wave resonators 15 and 16 are disposed so that the second wiring line 32 and third wiring line 33 do not cross each other. Specifically, the surface acoustic wave resonator 13 coupled between the second surface acoustic wave filter element 22 of the first surface acoustic wave filter section 3 and the second balance terminal 8, and the second surface acoustic wave filter element 22 are coupled to each other via a third wiring line 1023. On the other hand, as for the portion where the second surface acoustic wave filter section 4 is coupled to the first balance terminal 7, the second surface acoustic wave filter section 4 and the surface acoustic wave resonator 16 are coupled to each other via a second wiring line 1022. As shown in the drawing, the second wiring line 1022 and third wiring line 1023 do not cross each other.

Figure 3:
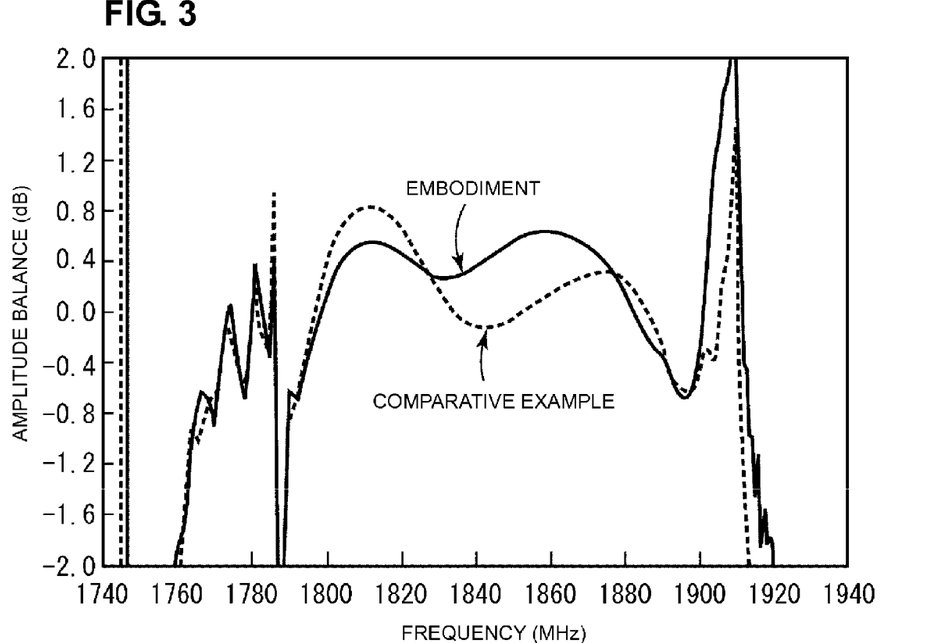
FIG. 3 is a graph showing amplitude balance characteristics of first surface acoustic wave filter sections of the surface acoustic wave filter apparatus according to the first preferred embodiment and that prepared to make a comparison.
Figure 4:
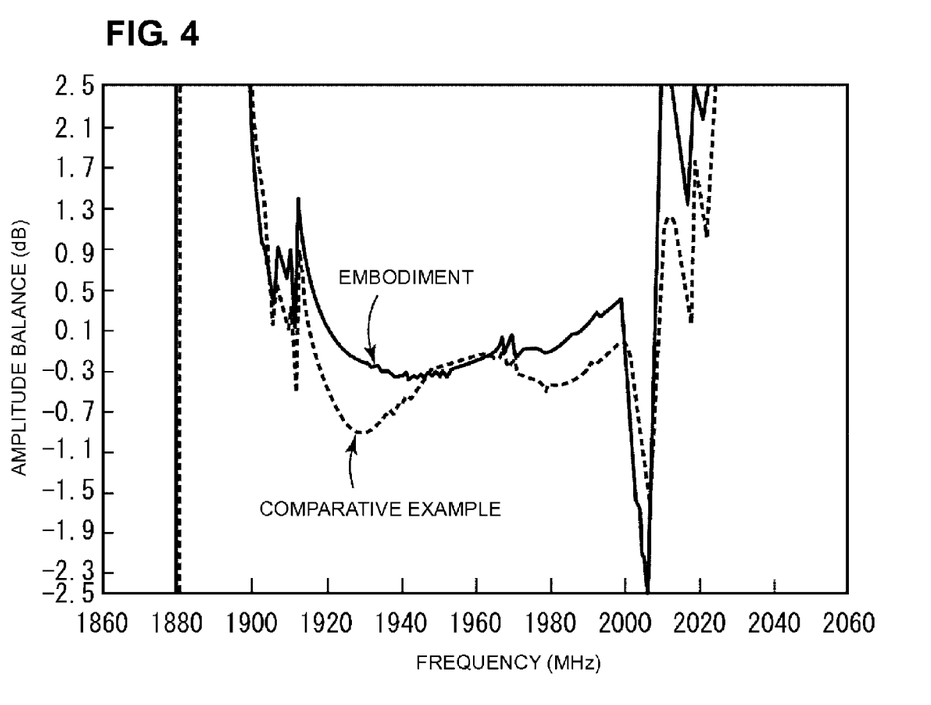
FIG. 4 is a graph showing amplitude balance characteristics of second surface acoustic wave filter sections of the surface acoustic wave filter apparatus according to the first preferred embodiment and that prepared to make a comparison.

FIG. 3 shows amplitude balance characteristics of the first surface acoustic wave filter sections of the surface acoustic wave filter apparatus according to the above-mentioned preferred embodiment and the surface acoustic wave filter apparatus according to the comparative example. FIG. 4 shows amplitude balance characteristics of the second surface acoustic wave filter sections of these surface acoustic wave filter apparatuses. In FIGS. 3 and 4, solid lines represent the result of the present preferred embodiment and broken lines represent the result of the above-mentioned comparative example.

Figure 5:
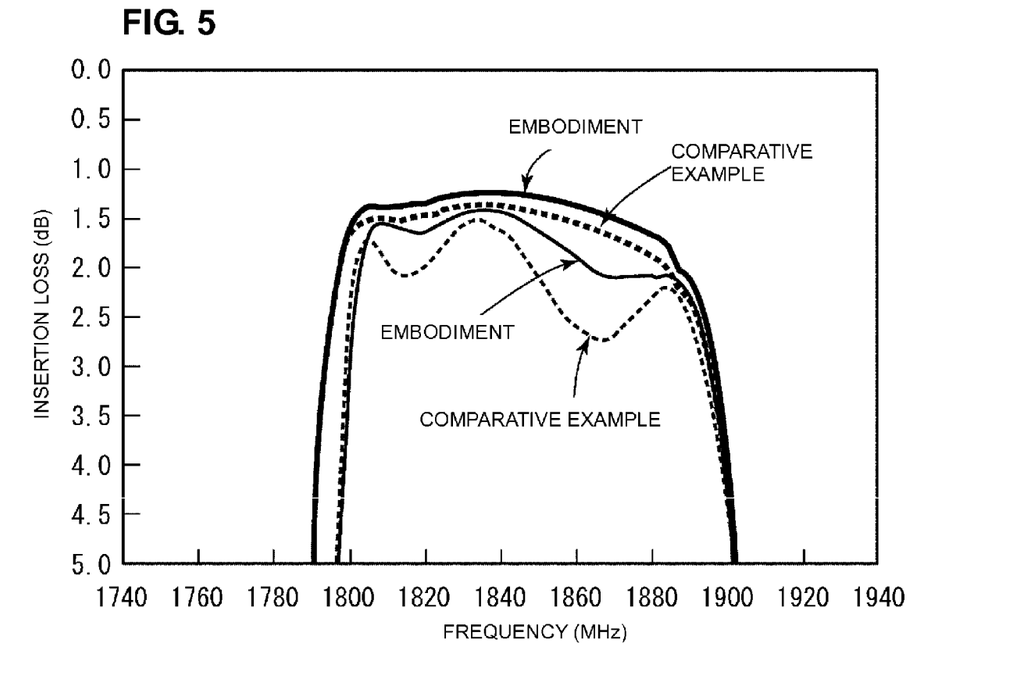
FIG. 5 is a graph showing transmission characteristics of the first surface acoustic wave filter sections of the surface acoustic wave filter apparatus according to the first preferred embodiment and that prepared to make a comparison.
Figure 6:
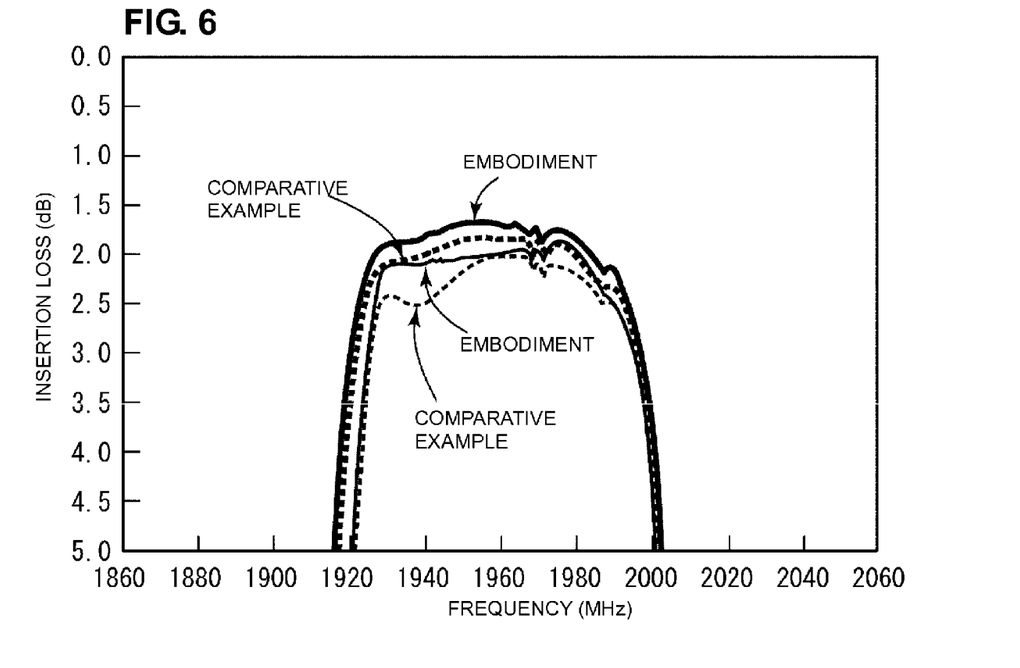
FIG. 6 is a graph showing transmission characteristics of the second surface acoustic wave filter sections of the surface acoustic wave filter apparatus according to the first preferred embodiment and that prepared to make a comparison.

FIGS. 5 and 6 show transmission characteristics of the first surface acoustic wave filter section 3 and second surface acoustic wave filter section 4. In FIG. 5, a solid line represents the result of the above-mentioned preferred embodiment and a heavy broken line represents the result of the above-mentioned comparative example. Also in FIG. 6, a heavy solid line represents the result of the above-mentioned preferred embodiment and a heavy broken line represents the result of the above-mentioned comparative example.

As is apparent in FIG. 3, it is understood that the amplitude balance characteristic of the first surface acoustic wave filter section 3, that is, the first surface acoustic wave filter section 3 serving as a DCS reception band filter, whose passband is 1805 MHz to 1880 MHz, improved from 0.85 dB in the comparative example to about 0.64 dB in the above-mentioned preferred embodiment. Similarly, as is apparent in FIG. 4, it is understood that the amplitude balance characteristic of the second surface acoustic wave filter section 4 serving as a PCD reception filter, whose passband is 1930 MHz to 1990 MHz, improved from 0.93 dB in the comparative example to about 0.42 dB in the present preferred embodiment. The amplitude balance represents the deviation from 0 dB.

As is apparent in FIG. 5, it is understood that the insertion loss in the first surface acoustic wave filter section 3 decreased from 1.89 dB in the comparative example to about 1.69 dB in the present preferred embodiment. Also, as is apparent in FIG. 6, it is understood that the insertion loss in the second surface acoustic wave filter section 4 serving as a PCS reception filter decreased from 2.36 dB to about 2.20 dB in the present preferred embodiment.

In FIGS. 5 and 6, thin solid lines and thin thin lines represent characteristics where a loss due to impedance mismatching has yet to be eliminated, and heavy solid lines and heavy broken lines represent transmission characteristics where a loss due to impedance mismatching has been eliminated.

As described above, according to this preferred embodiment, the amplitude balance characteristic improved from that in the comparative example. In other words, the balancing is improved and the insertion loss is decreased. This is due to the following reasons.

That is, the second wiring line 32 and third wiring line 33 cross each other, so the running portions of the second wiring line 32 and third wiring line 33 can be reduced. Therefore, the influence of the stray capacitance between the second and third wiring lines 32 and 33 and other portions, the inductance, and the resistance can be reduced and thus the difference between a first balance signal and a second balance signal is reduced so that the balancing is enhanced.

Also, since the lengths of the above-mentioned second and third wiring lines 32 and 33 can be reduced, the loss due to the resistance of the wiring lines can be reduced. Therefore, it can be considered that the insertion loss is reduced.

Also, since the second wiring line 32 and third wiring line 33 cross each other, the surface acoustic wave resonator 16 and surface acoustic wave resonator 13 can be distanced from each other. Thus, the coupling capacitance between the surface acoustic wave resonators 13 and 16 can be reduced. This also reduces the insertion loss.

Also, since the wiring lines between the surface acoustic wave filter sections 3 and 4 and the balance terminals 7 and 8 can be shortened, the chip size can be also reduced.

Assume that a surface acoustic wave resonator is coupled to a surface acoustic wave filter element in series. In this case, by setting the resonant frequency of the surface acoustic wave resonator within the passband of the surface acoustic wave filter element and setting the anti-resonance frequency thereof within a high band near the passband, the attenuation amount in the stopband in the high band of the passband can be increased and the steepness of the filter characteristics can be increased without deteriorating the insertion loss.

In order to reduce the insertion losses in the passbands of both the first and second surface acoustic wave filter sections 3 and 4 in the configuration where the balance terminals of the first and second surface acoustic wave filter sections 3 and 4 are commonly coupled to each other, as in this preferred embodiment, it is necessary to bring the impedance in the passband of one of the surface acoustic wave filters close to the matching point and increase the impedance in the passband of the other surface acoustic wave filter section. Thus, the impedance matching between both the passbands can be achieved so that the insertion losses in the passbands of the surface acoustic wave filter sections 3 and 4 can be reduced.

In this preferred embodiment, the fifth and sixth surface acoustic wave resonators 15 and 17 are coupled to the surface acoustic wave filter elements 23 and 24, respectively, in series so that impedance matching is achieved. In other words, in the second surface acoustic wave filter section 4 having a relatively high passband, the fifth and sixth surface acoustic wave resonators 15 and 17 are coupled between the first surface acoustic wave filter element 23 and first balance terminal 7 and between the second surface acoustic wave filter element 24 and second balance terminal 8, respectively. By coupling the surface acoustic wave resonators 15 and 17 to the surface acoustic wave filter elements 23 and 24 in series, the above-mentioned impedance adjustment is made possible.

Specifically, the anti-resonance frequencies of the impedance-adjusting surface acoustic wave resonators 15 and 17 are set so that they are higher than those of the above-mentioned surface acoustic wave resonators 16 and 18. Thus, the deterioration of the insertion loss in the passband of the second surface acoustic wave filter section 4 for PCD reception can be further prevented. At the same time, the insertion loss in the passband of the first surface acoustic wave filter section 3 that is intended to receive DCS and whose passband is relatively low can be greatly reduced and minimized.

Therefore, as in this preferred embodiment, it is preferably desirable to couple the fifth and sixth surface acoustic wave resonators 15 and 17 to the second and fourth surface acoustic wave resonators 16 and 18, respectively, in series in the second surface acoustic wave filter section 4 having a relatively high passband as described above.

Since the impedance-adjusting surface acoustic wave resonators 15 and 17 are smaller in size than the surface acoustic wave resonators 16 and 18 to which the resonators 15 and 17 are coupled in series, it is possible to smoothly dispose the surface acoustic wave resonators 15 and 17 by effectively using space on the piezoelectric substrate 2.

As for the first and second surface acoustic wave filter sections 3 and 4 according to the first preferred embodiment shown in FIG. 1, the input terminals of the three-IDT-type first and second surface acoustic wave filter elements preferably are commonly coupled to each other and then coupled to the first or second unbalance terminal. However, the configurations of the first and second surface acoustic wave filter sections are not limited to the above-mentioned preferred embodiment. Another preferred embodiment that is a modification of the above-mentioned configurations of the first and second surface acoustic wave filter sections will be described with reference to FIGS. 7 to 14.

In FIGS. 7 to 14, IDTs of each surface acoustic wave filter element are schematically shown using rectangular blocks. Also, reflectors are schematically shown using rectangular blocks each containing X. Also, one-port-type surface acoustic wave resonators are schematically shown using circuit symbols indicating resonators. The configuration of the first surface acoustic wave filter section 3 is hatched using multiple dots.

Figure 7:
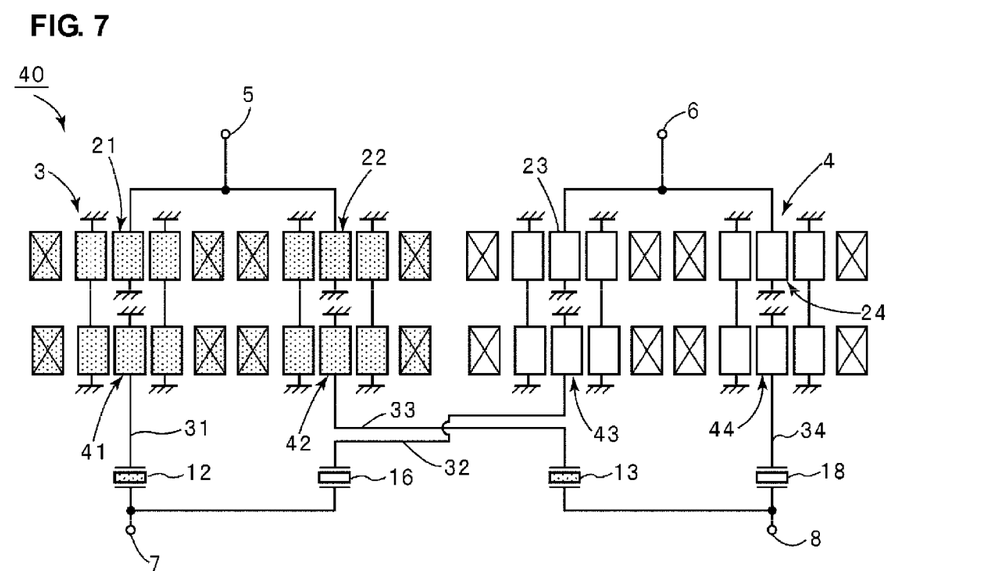
FIG. 7 is a schematic plan view showing an electrode structure of a surface acoustic wave filter apparatus according to a second preferred embodiment of the present invention.

FIG. 7 is a schematic plan view showing an electrode structure of a surface acoustic wave filter apparatus 40 according to a second preferred embodiment of the present invention. The surface acoustic wave filter apparatus 40 according to this preferred embodiment is different in the following points from the surface acoustic wave filter apparatus 1 according to the first preferred embodiment. Specifically, in the second preferred embodiment, the surface acoustic wave resonators 11 and 14 are preferably omitted, and the input terminals of the first and second surface acoustic wave filter sections 3 and 4 are directly coupled to the first and second unbalance terminals 5 and 6, respectively. Also, in the first surface acoustic wave filter section 3, three-IDT-type, longitudinally coupled resonator-type third and fourth surface acoustic wave filter elements 41 and 42 are longitudinally coupled to the output terminals of the first and second surface acoustic wave filter elements 21 and 22, respectively. Similarly, in the second surface acoustic wave filter section 4, three-IDT-type, longitudinally coupled resonator-type third and fourth surface acoustic wave filter elements 43 and 44 are longitudinally coupled to the rear of the first and second surface acoustic wave filter elements 23 and 24, respectively.

Since a balance-unbalance conversion function is realized using the first and second first surface acoustic wave filter elements 21 and 22 or first and second first surface acoustic wave filter elements 23 and 24, the third and fourth surface acoustic wave filter elements 41 to 44 are both preferably configured not to have a balance-unbalance conversion function.

Also, in this preferred embodiment, the impedance-adjusting surface acoustic wave resonators 15 and 17 are preferably omitted.

With respect to the other points, this preferred embodiment is preferably the same or substantially the same as the first preferred embodiment. As in the second preferred embodiment, the first and second surface acoustic wave filter sections 3 and 4 according to various preferred embodiments of the present invention may preferably have a two-stage, longitudinally coupled structure where surface acoustic wave filter elements are additionally coupled to the rear of the first and second surface acoustic wave filter elements.

Figure 8:
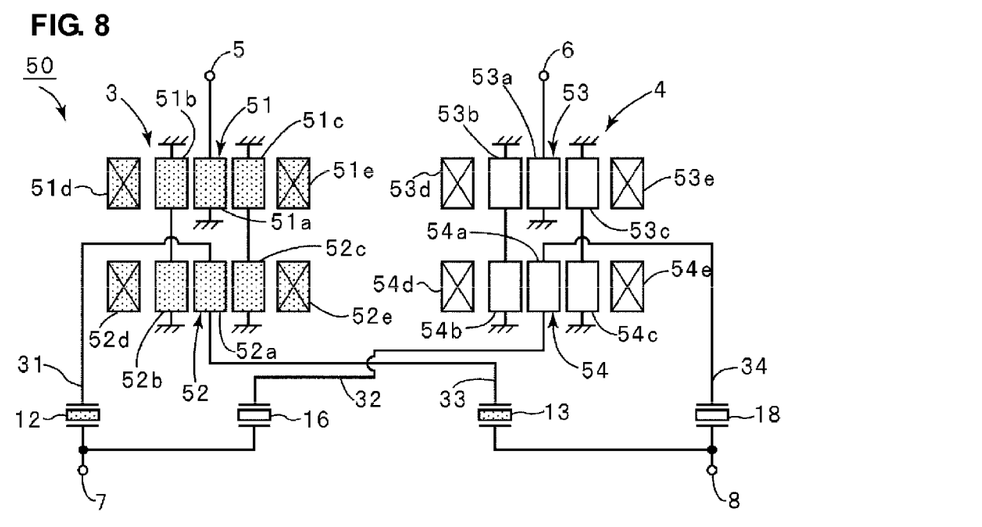
FIG. 8 is a schematic plan view showing an electrode structure of a surface acoustic wave filter apparatus according to a third preferred embodiment of the present invention.

FIG. 8 is a schematic plan view showing an electrode structure of a surface acoustic wave filter apparatus 50 according to a third preferred embodiment of the present invention. This preferred embodiment is different in the following points from the first preferred embodiment.

First, the surface acoustic wave resonators 11 and 14 according to the first preferred embodiment are preferably omitted. That is, the first and second surface acoustic wave filter sections 3 and 4 are directly coupled to the first and second unbalance terminals 5 and 6, respectively.

The first surface acoustic wave filter section 3 includes first and second three-IDT-type, longitudinally coupled resonator-type first and second surface acoustic wave filter elements 51 and 52, which are longitudinally coupled in two-stages. The three-IDT-type, longitudinally coupled resonator-type surface acoustic wave filter 51 includes a first IDT 51a, second and third IDTs 51b and 51c disposed on both sides of the IDT 51a in the surface acoustic wave propagation direction, and reflectors 51d and 51e. Similarly, the surface acoustic wave filter 52 includes a first IDT 52a, second and third IDTs 52b and 52c disposed on both sides of the IDT 52a, and reflectors 52d and 52e.

One end of the first IDT 51a of the first surface acoustic wave filter element 51 is coupled to the first unbalance terminal 5, and the other end thereof is coupled to a ground potential. Ends of the second and third IDTs 51b and 51c are coupled to ground potentials, and the other ends thereof are coupled to ends of the IDTs 52b and 52c, respectively. The other ends of the IDTs 52B and 52c are coupled to ground potentials. One end of the IDT 52a is coupled to the first balance terminal 7 via the surface acoustic wave resonator 12, and the other end thereof is coupled to the second balance terminal 8 via the surface acoustic wave resonator 13. Specifically, the IDT 52a is coupled to the surface acoustic wave resonator 13 via the third wiring line 33.

On the other hand, the second surface acoustic wave filter section 4 also includes three-IDT-type, longitudinally coupled resonator-type first and second surface acoustic wave filter elements 53 and 54, which are longitudinally coupled in two-stages. One end of the first IDT 53a of the first surface acoustic wave filter element 53 is coupled to the second unbalance terminal 6, and the other end thereof is coupled to a ground potential. Ends of the IDTs 53b and 53c are coupled to ground potentials, and the other ends thereof are coupled to ends of IDTs 54b and 54c, respectively. The other ends of the IDTs 54B and 54c are coupled to ground potentials. One end of the IDT 54a is coupled to the surface acoustic wave resonator 16 via the second wiring line 32 and then coupled to the first balance terminal 7 via the surface acoustic wave resonator 16. The other end of the IDT 54a is coupled to the surface acoustic wave resonator 18 via the fourth wiring line 34 and then coupled to the second balance terminal 8 via the surface acoustic wave resonator 18. Also, the surface acoustic wave filter elements 53 and 54 include reflectors 53d and 53e and reflectors 54d and 54e, respectively.

The surface acoustic wave filter apparatus according to this preferred embodiment is configured so that, by taking out signals from the one end and the other end of the first IDT 52a of the second surface acoustic wave filter element 52, the first surface acoustic wave filter section 3 has a balance-unbalance conversion function. The second surface acoustic wave filter section 4 is also configured to have a balance-unbalance conversion function in the same way. With respect to the other points, this preferred embodiment preferably has the same or substantially the same configuration as that of the second preferred embodiment.

Figure 9:
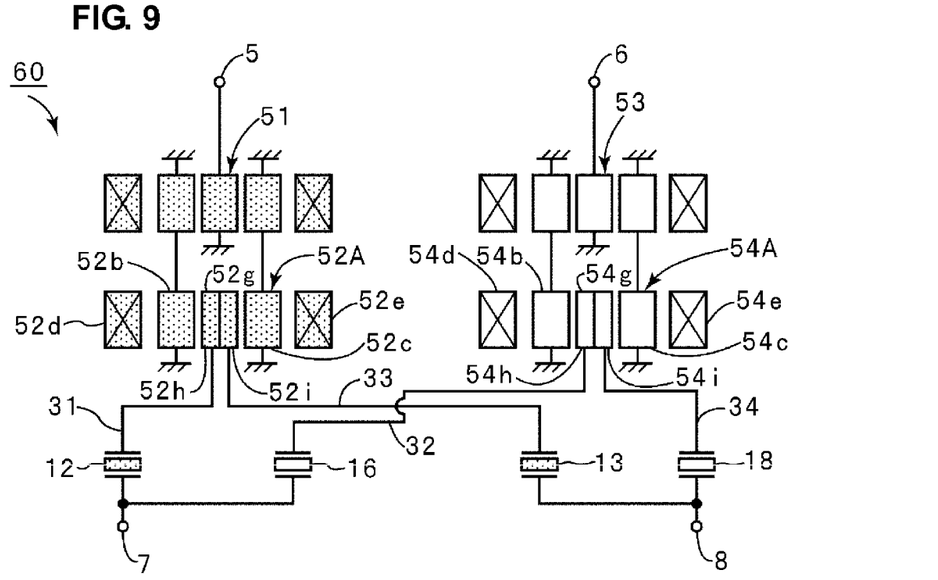
FIG. 9 is a schematic plan view showing an electrode structure of a surface acoustic wave filter apparatus according to a fourth preferred embodiment of the present invention.

FIG. 9 is a schematic plan view showing an electrode structure of a surface acoustic wave filter apparatus according to a fourth preferred embodiment of the present invention. A surface acoustic wave filter apparatus 60 according to the fourth preferred embodiment is equivalent to a structure obtained by deforming the surface acoustic wave filter apparatus 50 according to the third preferred embodiment. What is different from the third preferred embodiment is that a second surface acoustic wave filter element 52A is provided instead of the second surface acoustic wave filter element 52 of the first surface acoustic wave filter section 3, as shown in FIG. 9.

In the second surface acoustic wave filter element 52A, a centrally disposed IDT 52g includes first and second division IDT portions 52h and 52i obtained by dividing the IDT 52g in the surface acoustic wave propagation direction. The division IDT portion 52h is coupled to the surface acoustic wave resonator 12 via the first wiring line 31 and then coupled to the first balance terminal 7 via the surface acoustic wave resonator 12. The division IDT portion 52i is coupled to the surface acoustic wave resonator 13 via the third wiring line 33 and then coupled to the second balance terminal 8 via the surface acoustic wave resonator 13.

Similarly, a surface acoustic wave filter element 54A is provided instead of the fourth surface acoustic wave filter element 54 of the second surface acoustic wave filter section 4. Also in the surface acoustic wave filter element 54A, a centrally disposed first IDT 54g includes first and second division IDT portions 54h and 54i obtained by dividing the first IDT 54g into two portions in the surface acoustic wave propagation direction. The division IDT portion 54h is coupled to the surface acoustic wave resonator 16 via the second wiring line 32 and then coupled to the first balance terminal 7 via the surface acoustic wave resonator 16. Also, one end of the division IDT portion 54i is coupled to the surface acoustic wave resonator 18 via the fourth wiring line 34 and then coupled to the second balance terminal 8 via the surface acoustic wave resonator 18. The other components are preferably the same as those of the third preferred embodiment, so the components are given same reference numerals and will not be described.

Figure 10:
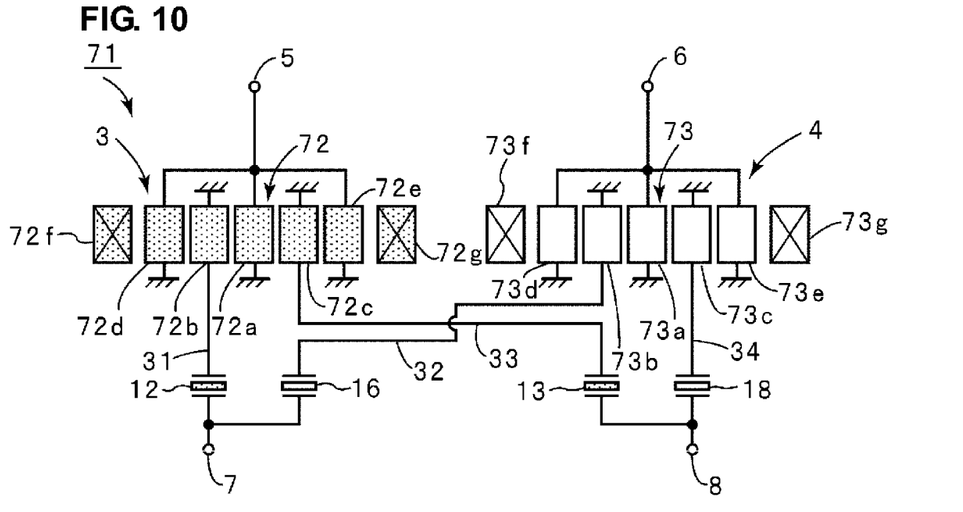
FIG. 10 is a schematic plan view showing an electrode structure of a surface acoustic wave filter apparatus according to a fifth preferred embodiment of the present invention.

FIG. 10 is a schematic plan view showing an electrode structure of a surface acoustic wave filter apparatus according to a fifth preferred embodiment of the present invention. In a second surface acoustic wave filter apparatus 71, the first and second surface acoustic wave filter sections 3 and 4 preferably include five-IDT-type, longitudinally coupled resonator-type first and second surface acoustic wave filter elements 72 and 73, respectively. With respect to the other components, this preferred embodiment is preferably the same or substantially the same as the second to fourth preferred embodiments.

The first surface acoustic wave filter element 72 includes a first IDT 72a, second and third IDTs 72b and 72c disposed on both sides of the first IDT 72a in the surface acoustic wave propagation direction, and fourth and fifth IDTs 72d and 72e disposed on both sides in the surface acoustic wave propagation direction, of the area where the IDTs 72a to 72c are provided. The surface acoustic wave filter element 73 also includes first to fifth IDTs 73a to 73e preferably configured in the same way.

The surface acoustic wave filter elements 72 and 73 include reflectors 72f and 72g and reflectors 73f and 73g, respectively, provided on both ends thereof in the surface acoustic wave propagation direction.

In the surface acoustic wave filter element 72, ends of the first IDT 72a and fourth and fifth IDTs 72d and 72e are commonly coupled to one another and then coupled to the first unbalance terminal 5, and the other ends thereof are coupled to ground potentials. Ends of the second and third IDTs 72b and 72c are coupled to ground potentials. The other end of the IDT 72b is coupled to the first surface acoustic wave resonator 12 via the first wiring line 31 and then coupled to the first balance terminal 7 via the surface acoustic wave resonator 12. Also, the other end of the IDT 72c is coupled to the surface acoustic wave resonator 13 via the third wiring line 33 and then coupled to the second balance terminal 8 via the surface acoustic wave resonator 13.

Similarly, in the second surface acoustic wave filter element 73, the other ends of the first, fourth, and fifth IDTs 73a, 73d, and 73e are coupled to ground potentials, and ends thereof are commonly coupled to one another and then coupled to the second unbalance terminal 6. One end of the second IDT 73b is coupled to a ground potential, and the other end thereof is coupled to the surface acoustic wave resonator 16 via the second wiring line 32. That is, the IDT 73b is coupled to the first balance terminal 7 via the surface acoustic wave resonator 16. On the other hand, one end of the IDT 73c is coupled to a ground potential, and the other end thereof is coupled to the surface acoustic wave resonator 18 via the fourth wiring line 34 and then coupled to the second balance terminal 8 via the surface acoustic wave resonator 18.

The first and second surface acoustic wave filter sections 3 and 4 may be configured using five-IDT-type, longitudinally coupled resonator-type surface acoustic wave filter elements. That is, according to a preferred embodiment of the present invention, the surface acoustic wave filter sections 3 and 4 can be configured using longitudinally coupled resonator-type surface acoustic wave filters including three or more IDTs, that is, at least three IDTs, but not limited thereto.

Figure 11:
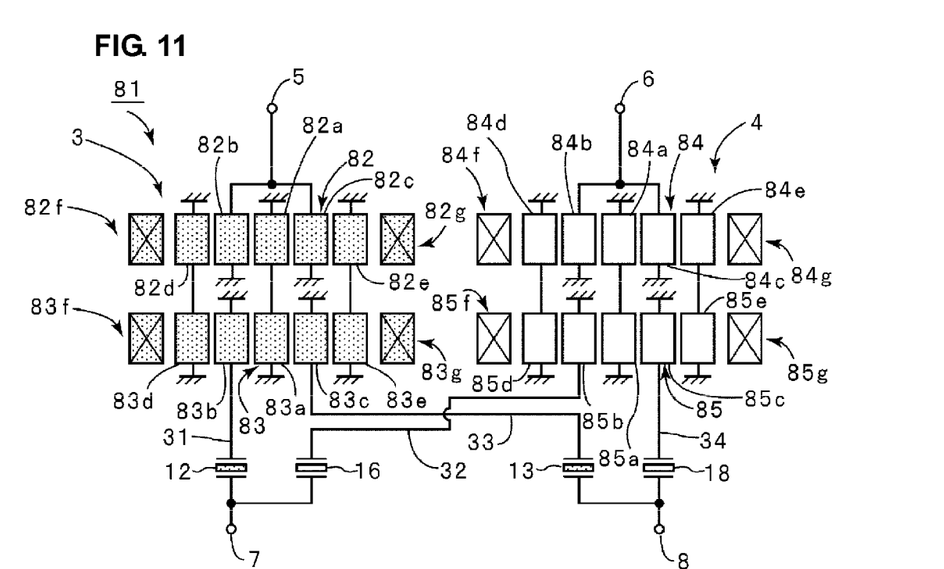
FIG. 11 is a schematic plan view showing an electrode structure of a surface acoustic wave filter apparatus according to a sixth preferred embodiment of the present invention.

FIG. 11 is a schematic plan view showing an electrode structure of a surface acoustic wave filter apparatus according to a sixth preferred embodiment of the present invention. In a surface acoustic wave filter apparatus 81, the first and second surface acoustic wave filter section 3 and 4 each have a structure where five-IDT-type, longitudinally coupled resonator-type surface acoustic wave filter elements are longitudinally coupled in two stages.

Specifically, the surface acoustic wave filter section 3 is configured preferably by coupling five-IDT-type, longitudinally coupled resonator-type first and second surface acoustic wave filter elements 82 and 83 longitudinally in two stages. Ends of the second and third IDTs 82b and 82c are commonly coupled to each other and then coupled to the first unbalance terminal 5, and the other ends thereof are coupled to ground potentials. Ends of first, fourth, and fifth IDTs 82a, 82d, and 82e are coupled to ground potentials. The other ends thereof are coupled to ends of first, fourth, and fifth IDTs 83a, 83d, and 83e, respectively, of a second surface acoustic wave filter element 83. The other ends of the IDTs 83a, 83d, 83e are coupled to ground potentials. Ends of the IDTs 83b and 83c are coupled to ground potentials. The other end of the second IDT 83b is coupled to the surface acoustic wave resonator 12 via the first wiring line 31 and then coupled to the first balance terminal 7 via the surface acoustic wave resonator 12. The other end of the third IDT 83c is coupled to the third balance terminal 13 via the third wiring line 33 and then coupled to the second balance terminal 8 via the surface acoustic wave resonator 13.

On the other hand, also in the second surface acoustic wave filter section 4, five-IDT-type, longitudinally coupled resonator-type surface acoustic wave filter elements 84 and 85 are longitudinally coupled in two stages. Portions corresponding to those of the surface acoustic wave filter elements 82 and 83, of the surface acoustic wave filter elements 84 and 85 are given corresponding reference numerals. For this reason, the portions will not be described. Here, one end of the second surface acoustic wave filter element 85 is coupled to the surface acoustic wave resonator 16 via the second wiring line 32 and then coupled to the first balance terminal 7 via the surface acoustic wave resonator 16. Also, one end of the third IDT section 85c is coupled to the surface acoustic wave resonator 18 via the fourth wiring line 34 and then coupled to the second balance terminal 8 via the surface acoustic wave resonator 18.

The surface acoustic wave filter sections 82 to 85 include reflectors 82f and 82g, reflectors 83f and 83g, reflectors 84f and 84g, and reflectors to 85f and 85g, respectively, disposed on both ends thereof.

The first and second surface acoustic wave filter sections 3 and 4 preferably may each have a structure where five-IDT-type, longitudinally coupled resonator-type surface acoustic wave filter sections are longitudinally coupled in two stages.

Figure 12:
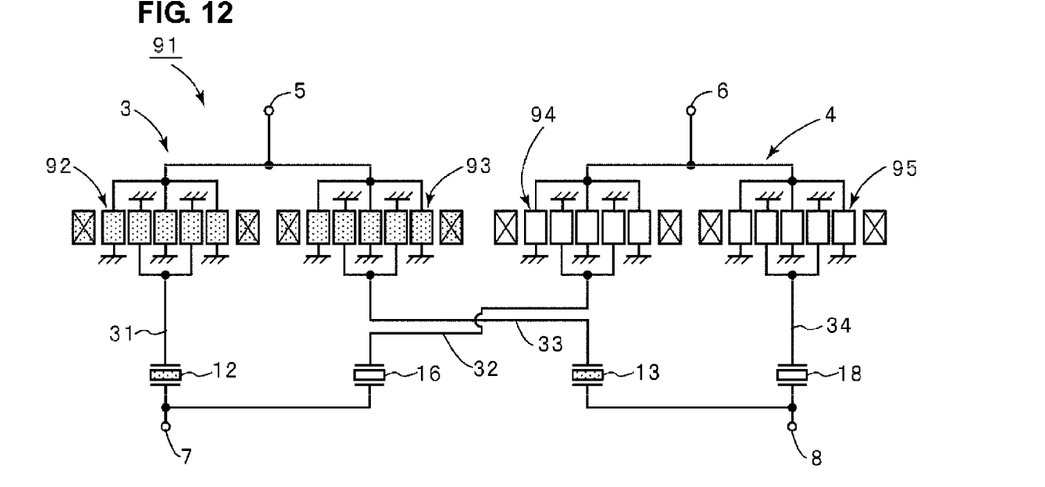
FIG. 12 is a schematic plan view showing an electrode structure of a surface acoustic wave filter apparatus according to a seventh preferred embodiment of the present invention.

FIG. 12 is a schematic plan view showing an electrode structure of a surface acoustic wave filter apparatus according to a seventh preferred embodiment of the present invention.

A surface acoustic wave filter apparatus 91 is equivalent to a modification of the surface acoustic wave filter apparatus according to the first preferred embodiment. Specifically, the surface acoustic wave filter apparatus 91 according to this preferred embodiment is different from the surface acoustic wave filter apparatus according to the first preferred embodiment in that the surface acoustic wave filter element 91 includes none of the surface acoustic wave resonators 11, 14, 15, and 17 but includes five-IDT-type, longitudinally coupled resonator-type surface acoustic wave filter elements 92, 93, 94, and 95 instead of the three-IDT-type, longitudinally coupled resonator-type surface acoustic wave filter elements 21, 22, 23, and 24. With respect to the other points, this preferred embodiment is preferably the same or substantially the same as the first preferred embodiment. For this reason, the same portions are given the same reference numerals and will not be described.

Specifically, in this preferred embodiment, ends of the five-IDT-type, longitudinally coupled resonator-type surface acoustic wave filters 92 and 93 are coupled to the first unbalance terminal 5. The other end of the surface acoustic wave filter element 92 is coupled to the surface acoustic wave resonator 12 via the first wiring line 31. The other end of the surface acoustic wave filter element 93 is coupled to the surface acoustic wave resonator 13 via the third wiring line 33. Also, ends of the surface acoustic wave filter elements 94 and 95 are commonly coupled to each other and then coupled to the second unbalance terminal 6. The other end of the surface acoustic wave filter element 94 is coupled to the surface acoustic wave resonator 16 via the second wiring line 32. The other end of the surface acoustic wave filter element 95 is coupled to the surface acoustic wave resonator 18 via the fourth wiring line 34.

Figure 13:
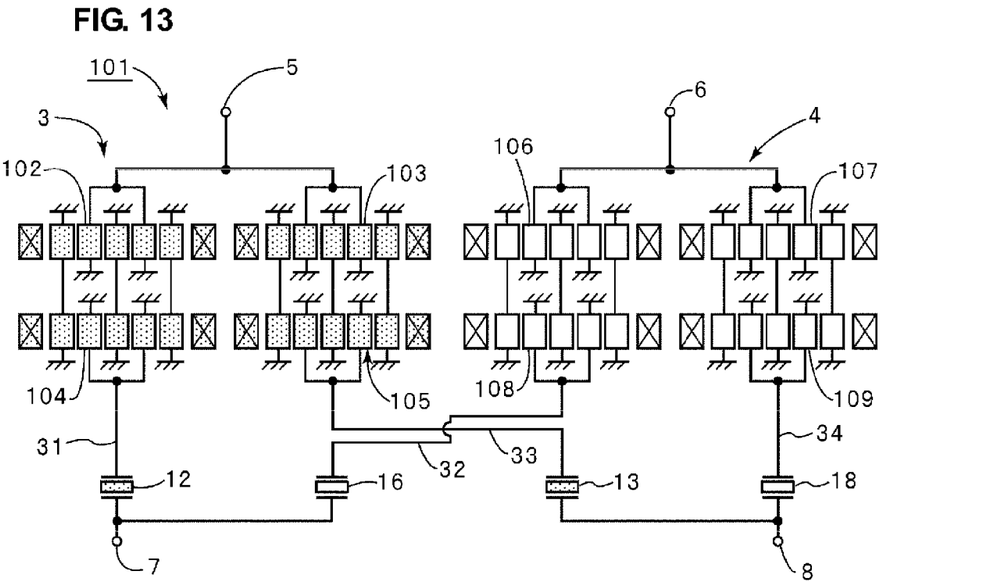
FIG. 13 is a schematic plan view showing an electrode structure of a surface acoustic wave filter apparatus according to an eighth preferred embodiment of the present invention.

FIG. 13 is a schematic plan view showing an electrode structure of a surface acoustic wave filter apparatus according to an eighth preferred embodiment of the present invention. In a second surface acoustic wave filter apparatus 101 according to this preferred embodiment, the first and second surface acoustic wave filter section 3 and 4 each preferably include five-IDT-type, longitudinally coupled resonator-type four surface acoustic wave filter elements.

Specifically, the first surface acoustic wave filter section 3 includes five-IDT-type, longitudinally coupled resonator-type surface acoustic wave filter elements 102 and 103 having input terminals are commonly coupled to the first unbalance terminal 5. Five-IDT-type, longitudinally coupled resonator-type third and fourth surface acoustic wave filter elements 104 and 105 are coupled to the rear of the longitudinally coupled resonator-type first and second surface acoustic wave filter elements 102 and 103, respectively.

Similarly, in the second surface acoustic wave filter section 4, ends of five-IDT-type, longitudinally coupled resonator-type first and second surface acoustic wave filter elements 106 and 107 are commonly coupled to each other and then coupled to the second unbalance terminal 6. Five-IDT-type, longitudinally coupled resonator-type third and fourth surface acoustic wave filter elements 108 and 109 are coupled to the rear of the first and second resonator-type surface acoustic wave filter elements 106 and 107, respectively. The first and second surface acoustic wave filter sections 3 and 4 preferably may each be configured to have two structures, in each of which five-IDT-type, longitudinally coupled resonator-type surface acoustic wave filter elements are longitudinally coupled in two stages.

Figure 14:
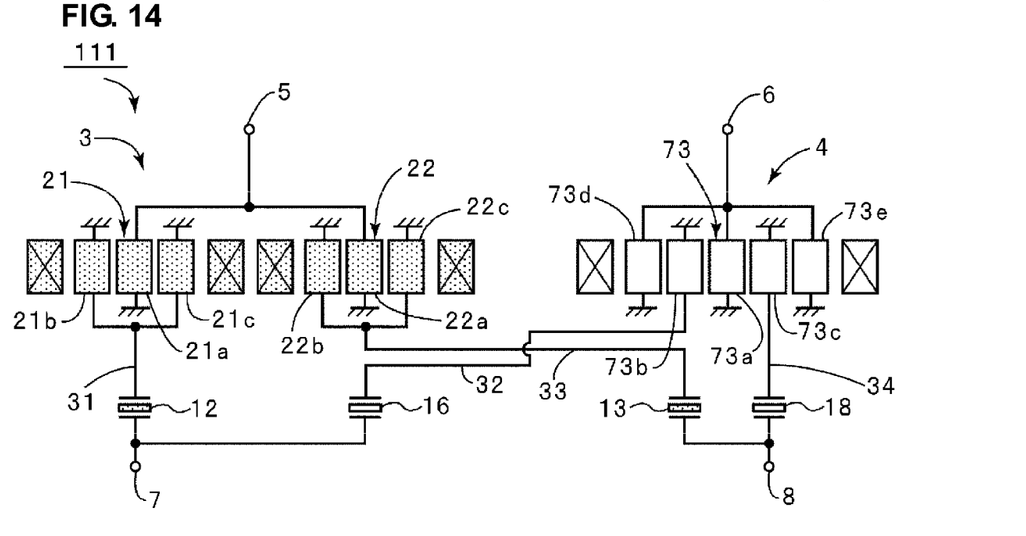
FIG. 14 is a schematic plan view showing an electrode structure of a surface acoustic wave filter apparatus according to a ninth preferred embodiment of the present invention.

FIG. 14 is a schematic plan view showing an electrode structure of a surface acoustic wave filter apparatus according to a ninth preferred embodiment of the present invention.

As with the first surface acoustic wave filter section 3 of the surface acoustic wave filter apparatus 1 according to the first preferred embodiment, the first surface acoustic wave filter section 3 of a second surface acoustic wave filter apparatus 111 according to this preferred embodiment includes three-IDT-type, longitudinally coupled resonator-type first and second surface acoustic wave filter elements 21 and 22. On the other hand, as with the second surface acoustic wave filter section 4 of the above-mentioned surface acoustic wave filter apparatus 71 shown in FIG. 10, the second surface acoustic wave filter section 4 includes a five-IDT-type, longitudinally coupled resonator-type surface acoustic wave filter 73. With respect to the other points, the surface acoustic wave filter apparatus 111 according to this preferred embodiment has the same or substantially the same configuration as that of the surface acoustic wave filter apparatus 71 shown in FIG. 10.

In a preferred embodiment of the present invention, one of the first and second surface acoustic wave filters 3 and 4 may preferably include a five-IDT-type, longitudinally coupled resonator-type surface acoustic wave filter element, and the other thereof may preferably include a three-IDT-type, longitudinally coupled resonator-type surface acoustic wave filter element. That is, the number of the IDTs of the surface acoustic wave filter element defining the first surface acoustic wave filter section may be equal to or different from the number of the IDTs of the longitudinally coupled resonator-type surface acoustic wave filter element defining the second surface acoustic wave filter section.

Also, the number of the surface acoustic wave filter elements of the first surface acoustic wave filter section 3 may be equal to or different from the number of the surface acoustic wave filter elements of the second surface acoustic wave filter section 4.

Also in the preferred embodiments shown in FIGS. 7 to 14, the second wiring line 32 and third wiring line 33 preferably cross each other. Therefore, as with the first preferred embodiment, the balancing can be improved and the insertion loss can be reduced.

Also in these preferred embodiments, by coupling the surface acoustic wave resonators to the second and fourth surface acoustic wave resonators in series in the second surface acoustic wave filter section 4 having a relatively high frequency so as to adjust impedance, impedance matching between both the passbands can be achieved and the insertion losses in the filter sections 3 and 4 can be reduced.

Figure 15:
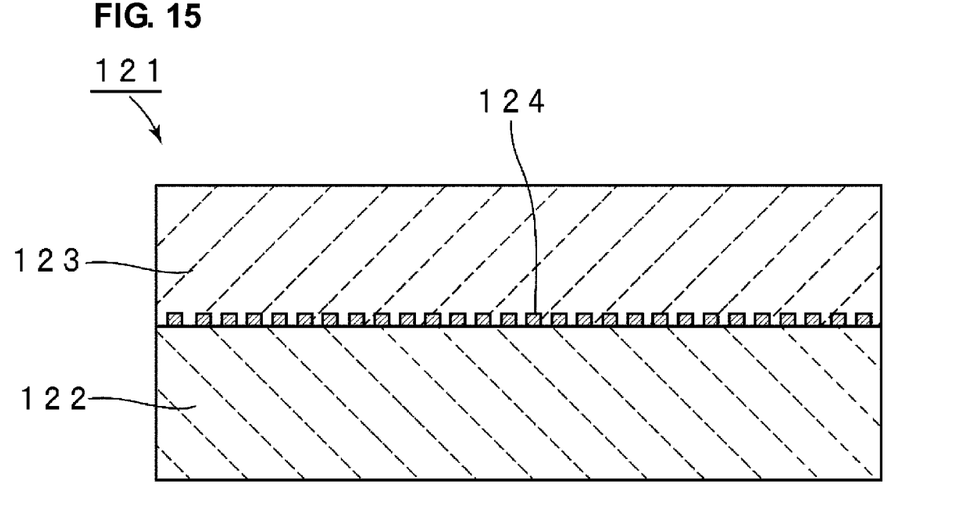
FIG. 15 is a schematic front sectional view showing one example of an acoustic boundary wave apparatus to which a preferred embodiment of the present invention is applied.

While the above-mentioned preferred embodiments show the structures, in each of which, preferred embodiments of the present invention are preferably applied to a surface acoustic wave filter apparatus, one of the unique features of preferred embodiments of the present invention is an electrode structure where the above-mentioned first and second surface acoustic wave filter sections 3 and 4 are coupled to the first to fourth surface acoustic wave resonators. Without being limited to surface acoustic wave apparatuses, the present invention is also applicable to acoustic boundary wave apparatuses using acoustic boundary waves. Specifically, in an acoustic boundary wave apparatus 121 shown using a simplified front sectional view in FIG. 15, a dielectric material is laminated on a piezoelectric substrate 122 made of a piezoelectric material. An electrode structure 124 including IDTs is provided on the interface between the piezoelectric substrate 122 and dielectric material 123. By forming any one of the electrode structures according to the above-mentioned preferred embodiments as the electrode structure 124, it is possible to provide an acoustic boundary wave filter apparatus according to a preferred embodiment of the present invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave filter apparatus comprising:
   a piezoelectric substrate;
   a first acoustic wave filter section disposed on the piezoelectric substrate, having a balance-unbalance conversion function and including an unbalance input/output terminal and first and second balance input/output terminals;
   a second acoustic wave filter section disposed on the piezoelectric substrate, having a different passband from that of the first acoustic wave filter, having a balance-unbalance conversion function, and including an unbalance input/output terminal and first and second balance input/output terminals; wherein the unbalance input/output terminals of the first and second acoustic wave filter sections are coupled to first and second unbalance terminals, respectively, the first balance input/output terminals of the first and second acoustic wave filter sections are commonly coupled to each other and then coupled to a first balance terminal, and the second balance input/output terminals of the first and second are commonly coupled to each other and then coupled to a second balance terminal;
   the first and second acoustic wave filter sections are configured so that a signal flowing to the first balance terminal and a signal flowing to the second balance terminal have opposite phases;
   the acoustic wave filter apparatus further comprising:
   a first acoustic wave resonator coupled between the first balance input/output terminal of the first acoustic wave filter section and the first balance terminal;
   a second acoustic wave resonator coupled between the first balance input/output terminal of the second acoustic wave filter section and the first balance terminal, the second acoustic wave resonator having a resonant frequency different from a resonant frequency of the first acoustic wave resonator;
   a third acoustic wave resonator coupled between the second balance input/output terminal of the first acoustic wave filter section and the second balance terminal;
   a fourth acoustic wave resonator coupled between the second balance input/output terminal of the second acoustic wave filter section and the second balance terminal, the fourth acoustic wave resonator having a resonant frequency different from a resonant frequency of the third acoustic wave resonator; and
   first, second, third and fourth wiring lines electrically coupling the first, second, third and fourth acoustic wave resonators to the first balance input/output terminal of the first acoustic wave filter section, the first balance input/output terminal of the second acoustic wave filter section, the second balance input/output terminal of the first acoustic wave filter section, and the second balance input/output terminal of the second acoustic wave filter section, respectively; wherein the second wiring line coupling the second acoustic wave resonator to the first balance input/output terminal of the second acoustic wave filter section and the third wiring line coupling the third acoustic wave resonator to the second balance input/output terminal of the first acoustic wave filter section cross each other on the piezoelectric substrate.

2. The acoustic wave filter apparatus according to claim 1, wherein the first, second, third and fourth acoustic wave resonators are arranged in this order along a direction on the piezoelectric substrate.

3. The acoustic wave filter apparatus according to claim 1, wherein a passband of the second acoustic wave filter section is located in a higher band than a bandpass of the first acoustic wave filter section, and the acoustic wave filter apparatus further comprises fifth and sixth acoustic wave resonators arranged to achieve impedance adjustment and coupled to the second and fourth acoustic wave resonators in series.

4. The acoustic wave filter apparatus according to claim 1, wherein the first acoustic wave filter section includes a longitudinally coupled resonator-type first acoustic wave filter element including at least three IDTs and a longitudinally coupled resonator-type second acoustic wave filter element including at least three IDTs, first ends of the first and second acoustic wave filter elements are coupled to the first unbalance terminal, a second end of the first acoustic wave filter element is coupled to the first balance terminal, and a second end of the second acoustic wave filter element is coupled to the second balance terminal.

5. The acoustic wave filter apparatus according to claim 4, wherein the second acoustic wave filter section includes a longitudinally coupled resonator-type first acoustic wave filter element including at least three IDTs and a longitudinally coupled resonator-type second acoustic wave filter element including at least three IDTs, first ends of the first and second acoustic wave filter elements are commonly coupled to each other and coupled to the second unbalance terminal, a second end of the first acoustic wave filter element is coupled to the first balance terminal, and a second end of the second acoustic wave filter element is coupled to the second balance terminal.

6. The acoustic wave filter apparatus according to claim 1, wherein a surface acoustic wave is used as an acoustic wave and the acoustic wave filter apparatus has a structure that utilizes the surface acoustic wave.

7. The acoustic wave filter apparatus according to claim 1, further comprising a dielectric material laminated on the piezoelectric substrate, wherein the acoustic wave filter apparatus is an acoustic boundary wave filter apparatus using an acoustic boundary wave propagating over an interface between the piezoelectric substrate and the dielectric material.

* * * * *